United States Patent
Smith et al.

(10) Patent No.: US 9,580,817 B2
(45) Date of Patent: Feb. 28, 2017

(54) BILAYER CHROMIUM NITRIDE COATED ARTICLES AND RELATED METHODS

(71) Applicant: VERGASON TECHNOLOGY, INC., Van Etten, NY (US)

(72) Inventors: Ricky L. Smith, Van Etten, NY (US); Mark A. Fitch, Horseheads, NY (US); Gary E. Vergason, Athens, PA (US)

(73) Assignee: Vergason Technology, Inc., Van Etten, NY (US)

( * ) Notice: Subject to any disclaimer, the term of this patent is extended or adjusted under 35 U.S.C. 154(b) by 0 days.

(21) Appl. No.: 14/096,141

(22) Filed: Dec. 4, 2013

(65) Prior Publication Data
US 2014/0154487 A1 Jun. 5, 2014

Related U.S. Application Data

(60) Provisional application No. 61/773,075, filed on Dec. 4, 2012.

(51) Int. Cl.
*C23C 28/04* (2006.01)
*C23C 14/00* (2006.01)
(Continued)

(52) U.S. Cl.
CPC ........ *C23C 28/042* (2013.01); *C23C 14/0042* (2013.01); *C23C 14/0641* (2013.01);
(Continued)

(58) Field of Classification Search
CPC ............ C10N 2210/06; C10N 2230/12; C10N 2230/40; C23C 14/0641; C23C 14/025;
(Continued)

(56) References Cited

U.S. PATENT DOCUMENTS

| 4,131,530 A | 12/1978 | Blum et al. |
| 4,183,975 A | 1/1980 | Sidders |

(Continued)

FOREIGN PATENT DOCUMENTS

| CN | 103132019 | 12/2013 |
| EP | 2230330 | 12/2010 |

(Continued)

OTHER PUBLICATIONS

Zhou et al., Corrosion resistance of duplex and gradient CrNx coated H13 steel, Applied Surface Science vol. 211, Issues 1-4, Apr. 30, 2003, pp. 293-299.

(Continued)

*Primary Examiner* — Maria Veronica Ewald
*Assistant Examiner* — Travis Figg
(74) *Attorney, Agent, or Firm* — Bond, Schoeneck & King, PLLC; William Greener; Alek Szecsy

(57) ABSTRACT

A method for forming a chromium nitride coating over a substrate to provide a chromium nitride coated article, and the resulting chromium nitride coated article, each use a bilayer chromium nitride containing material layer. The bilayer chromium nitride containing material layer includes: (1) a first chromium nitride material layer having a first thickness, a first uniform chromium concentration and a first uniform nitrogen concentration located and formed closer to a substrate which provides the article; and (2) a second chromium nitride material layer having a second thickness, a second increasingly graded chromium concentration and a second decreasingly graded nitrogen concentration located and formed upon the first chromium nitride material layer. This particular bilayer chromium nitride containing material layer provides the article with superior reflectivity and crack resistance.

21 Claims, 1 Drawing Sheet

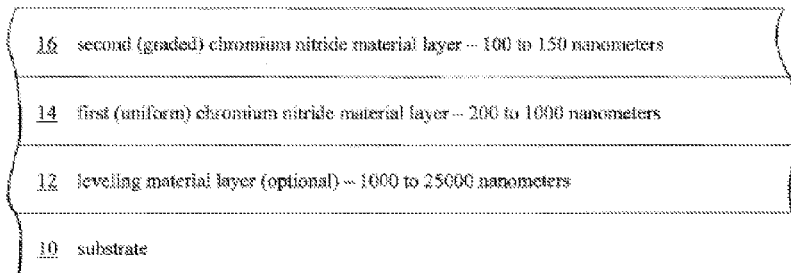

(51) Int. Cl.
*C23C 14/06* (2006.01)
*C23C 14/35* (2006.01)
*C23C 28/00* (2006.01)

(52) U.S. Cl.
CPC .......... *C23C 14/351* (2013.01); *C23C 28/048* (2013.01); *C23C 28/322* (2013.01); *C23C 28/34* (2013.01); *C23C 28/36* (2013.01); *Y10T 428/2495* (2015.01); *Y10T 428/24975* (2015.01)

(58) Field of Classification Search
CPC .............. C23C 14/0084; C23C 14/027; Y10T 428/2495; Y10T 428/24975
USPC ................... 428/212–220; 427/255.395, 261
See application file for complete search history.

(56) References Cited

U.S. PATENT DOCUMENTS

| | | | |
|---|---|---|---|
| 5,582,414 A | | 12/1996 | Miyazaki |
| 5,587,227 A | | 12/1996 | Ooya |
| 5,672,386 A | | 9/1997 | Ooya |
| 6,346,327 B1 | * | 2/2002 | Mokerji .................. B32B 15/08 428/412 |
| 6,399,152 B1 | | 6/2002 | Goodrich |
| 6,399,219 B1 | | 6/2002 | Weity et al. |
| 6,861,105 B2 | | 3/2005 | Veerasamy |
| 2005/0003239 A1 | | 1/2005 | Derflinger et al. |
| 2007/0291381 A1 | * | 12/2007 | Wuillaume .............. G02B 5/08 359/838 |
| 2008/0095939 A1 | | 4/2008 | Fischer et al. |
| 2008/0213503 A1 | | 9/2008 | Dearnaley et al. |
| 2009/0202790 A1 | | 8/2009 | Eerden et al. |
| 2009/0252968 A1 | | 10/2009 | Werger et al. |
| 2009/0324937 A1 | * | 12/2009 | Lev ....................... C23C 14/025 428/336 |
| 2010/0151271 A1 | | 6/2010 | Wei et al. |
| 2010/0187765 A1 | | 7/2010 | Hoppe et al. |
| 2011/0052931 A1 | | 3/2011 | Morton et al. |
| 2012/0035739 A1 | | 2/2012 | Wilhemsson et al. |
| 2012/0171508 A1 | * | 7/2012 | Chang ................... C23C 14/345 428/610 |
| 2012/0282478 A1 | | 11/2012 | Oseguera Pena et al. |
| 2013/0209767 A1 | | 8/2013 | Kolev et al. |

FOREIGN PATENT DOCUMENTS

| | | | | |
|---|---|---|---|---|
| GB | 2243162 A | * | 10/1991 | ............. C23C 14/06 |
| GB | 2243162 | | 12/1993 | |
| GB | 2314604 | | 12/1998 | |
| JP | 6331554 | | 12/1988 | |
| WO | 2011103551 | | 8/2011 | |
| WO | 2012116818 | | 9/2012 | |

OTHER PUBLICATIONS

Tsunekawa et al., Chromium-nitride in situ composites with a compositional gradient formed by reactive DC plasma spraying, Journal of Thermal Spray Technology Jun. 1996, vol. 5, Issue 2, pp. 139-144.
Written Opinion and International Search Report Form PCT/ISA/220, International Application No. PCT/US2014/014421, pp. 1-15, dated Sep. 3, 2014.

* cited by examiner

| 16 | second (graded) chromium nitride material layer – 100 to 150 nanometers |
| 14 | first (uniform) chromium nitride material layer – 200 to 1000 nanometers |
| 12 | leveling material layer (optional) – 1000 to 25000 nanometers |
| 10 | substrate |

BILAYER CHROMIUM NITRIDE COATED ARTICLES AND RELATED METHODS

CROSS-REFERENCE TO RELATED APPLICATION

This application is related to, and derives priority from, U.S. Provisional Patent Application Ser. No. 61/733,075, filed 4 Dec. 2012 and titled Chromium Containing Coating Method and Related Articles, the content of which is incorporated herein fully by reference.

STATEMENT OF GOVERNMENT INTEREST

Not applicable.

BACKGROUND

Field of the Invention

Embodiments relate to chromium nitride containing coatings. More particularly, embodiments relate to high performance chromium nitride containing coatings.

Description of the Related Art

Chromium containing coatings are common coatings that have various decorative and functional applications within the context of a plurality of industrial and consumer products. Given this broad applicability of chromium containing coatings in such a plurality of industrial and consumer products, desirable are additional chromium containing coatings and additional chromium containing coated articles that possess enhanced performance characteristics.

SUMMARY

Embodiments include: (1) a method for forming a chromium nitride containing coating over a substrate, to provide a chromium nitride containing coated article; and (2) the chromium nitride containing coated article that results from the method for forming the chromium nitride containing coating over the substrate. Within the embodiments, the chromium nitride containing coated article includes the chromium nitride containing coating that is located and formed over the substrate as a bilayer chromium nitride containing material layer that includes: (1) a first chromium nitride material layer located and formed over the substrate and having a first thickness, a first uniform chromium concentration and a first uniform nitrogen concentration; and (2) a second chromium nitride material layer located and formed upon the first chromium nitride material layer and having a second thickness, a second progressively increasing chromium concentration and a second progressively decreasing nitrogen concentration as a function of distance from the first chromium nitride material layer.

A chromium nitride containing coated article in accordance with the embodiments is intended as providing similar reflectivity and inhibited crack susceptibility in comparison with a related article that utilizes only a chromium containing coating and not necessarily a chromium nitride containing coating.

Within the context of the embodiments as disclosed and the invention as claimed, use of the terminology "over" for a coating material layer with respect to a substrate or another coating material layer is intended to indicate a vertical alignment of the coating material layer with respect to the substrate or the other coating material layer, but not necessarily contact of the coating material layer with respect to the substrate or the other coating material layer.

Within the context of the embodiments as disclosed and the invention as claimed, use of the terminology "upon" for a coating material layer with respect to a substrate or another coating material layer is intended to indicate a vertical alignment of the coating material layer with respect to the substrate or the other coating material layer, but also contact of the coating material layer with the substrate or the other coating material layer.

A particular article in accordance with the embodiments comprises a substrate. The particular article also comprises a first chromium nitride material layer located over the substrate and having a first thickness, a first uniform chromium concentration and a first uniform nitrogen concentration. The particular article also comprises a second chromium nitride material layer located upon the first chromium nitride material layer and having a second thickness, a second progressively graded increasing chromium concentration and a second progressively graded decreasing nitrogen concentration.

Another particular article in accordance with the embodiments consists of a substrate. The particular article also consists of a first chromium nitride material layer located upon the substrate and having a first thickness, a first uniform chromium concentration and a first uniform nitrogen concentration. The particular article also consists of a second chromium nitride material layer located upon the first chromium nitride material layer and having a second thickness, a second progressively graded increasing chromium concentration and a second progressively graded decreasing nitrogen concentration.

Yet another particular article in accordance with the embodiments consists of a substrate. The particular article also consists of a leveling material layer located upon the substrate. The particular article also consists of a first chromium nitride material layer located upon the leveling material layer and having a first thickness, a first uniform chromium concentration and a first uniform nitrogen concentration. The particular article also consists of a second chromium nitride material layer located upon the first chromium nitride material layer and having a second thickness, a second progressively graded increasing chromium concentration and a second progressively graded decreasing nitrogen concentration.

A particular method in accordance with the embodiments includes forming over a substrate a first chromium nitride material layer having a first thickness, a first uniform chromium concentration and a first uniform nitrogen concentration. The method also includes forming over the substrate and upon the first chromium nitride material layer a second chromium nitride material layer having a second thickness, a second progressively graded increasing chromium concentration and a second progressively graded decreasing nitrogen concentration.

BRIEF DESCRIPTION OF THE DRAWINGS

The objects, features and advantages of the embodiments are understood within the context of the Detailed Description of the Non-Limiting Embodiments, as set forth below. The Detailed Description of the Non-Limiting Embodiments is understood within the context of the sole accompanying drawing FIGURE, which forms a material part of this disclosure, wherein:

FIG. 1 shows a schematic cross-sectional diagram of a substrate having located and formed thereover a bilayer chromium nitride material layer in accordance with the embodiments.

DETAILED DESCRIPTION OF THE NON-LIMITING EMBODIMENTS

I. General Features of Bilayer Chromium Nitride Material Layer Coated Article and Method Bilayer chromium nitride material layer coatings in accordance with the embodiments represent a substantial improvement over current coatings which are designed and intended to replace electroplated chromium coatings. In accordance with the embodiments, an innovative aspect of such bilayer chromium nitride material layer coatings is to deposit upon or over a substrate a first chromium nitride material layer which is primarily stoichiometric chromium nitride (CrN) (although the embodiments are not limited to stoichiometric chromium nitride) instead of pure chromium. Utilizing reactive magnetron sputtering (or reactive arc evaporation), a stoichiometric chromium nitride first chromium nitride material layer may be deposited directly upon an organic polymer substrate or a metal substrate to a thickness of at least about 200 nm. First chromium nitride material layer coatings thicker than 200 nm will exhibit better abrasion resistance, but will also be more costly to produce. Therefore, a preferred thickness range of a stoichiometric first chromium nitride material layer in accordance with the embodiments is from about 200 nm to about 1000 nm, and more preferably from about 300 nm to about 700 nm. Once the desired thickness of a first chromium nitride material layer has been reached, a second chromium nitride material layer is located and formed upon the first chromium nitride material layer to provide a bilayer chromium nitride material layer. A composition of the second chromium nitride material layer is altered as a function of a thickness of the second chromium nitride material layer (i.e., which is inherently if not implicitly or explicitly understood by a person skilled in the art as an increasing perpendicular distance to the first chromium nitride material layer). To that end, a chromium content within the second chromium nitride material layer is continuously increased and a nitrogen content within the second chromium nitride material layer is continuously decreased (i.e., as a function of increasing perpendicular distance to the first chromium nitride material layer which equals the second chromium nitride material layer thickness) until the surface of the second chromium nitride material layer (i.e., opposite an interface of the first chromium nitride material layer and the second chromium nitride material layer) is reached. The very surface of the second chromium nitride material layer may be 100% chromium (Cr) metal, and may not necessarily contain any chromium nitride alloy. This gradient (of CrN to Cr) that provides the second chromium nitride material layer should extend at least 100 nm in thickness, and generally in a range from about 100 nm to about 150 nm. An abrupt change from stoichiometric chromium nitride (CrN) to pure chromium (Cr) may result in a bilayer chromium nitride material layer that is prone to thermally induced cracking.

The embodiments are believed to provide a superior bilayer chromium nitride material layer insofar as stoichiometric chromium nitride (CrN) is known to have a higher coefficient of thermal expansion (CTE) in comparison with chromium (Cr), thus decreasing an amount of tensile stress in a bilayer chromium nitride material layer in accordance with the embodiments during thermal variations. Stoichiometric chromium nitride (CrN) is also well known as a crack resistant PVD coating when utilized in tribological applications, such as cutting tools. Stoichiometric chromium nitride (CrN) has a silver-gray appearance, but is substantially lower in reflectivity than electroplated chromium (~55% vs ~74%). Thus, a reflective coating composed of stoichiometric chromium nitride (CrN) alone will generally appear too dark for most applications (unless one is attempting to create a "dark chrome" or "smoked chrome" effect, to which this particular bilayer chromium nitride material layer coating is very well suited). In accordance with the embodiments, an innovation is to gradually transition a second chromium nitride material layer within a bilayer chromium nitride material layer from a stoichiometric chromium nitride (CrN) to pure chromium (Cr) at the surface of the second chromium nitride material layer (or alternatively to a comparatively chromium rich chromium nitride at the surface of the second chromium nitride material layer). This creates a bilayer chromium nitride material layer which is both crack-resistant as well as brightly reflective (similar to electroplated chromium).

In magnetron sputtering an inert gas (usually argon) is required for bombarding a source metal target (Cr) causing ejected (sputtered) metal atoms and related species. If one mixes a partial pressure of nitrogen with the argon gas, the metal reacts with the nitrogen to form a metal-nitride at the surface of a substrate (i.e., via reactive sputtering). Within the context of the embodiments as described herein, the metal is chromium and the metal-nitride is chromium nitride. To create the aforementioned gradient layer near the surface of the second chromium nitride material layer, a ratio of nitrogen to argon is gradually reduced from 90% nitrogen/10% argon to 100% argon while maintaining the same flow rate (approximately 200 sccm) within a deposition apparatus. Thus, the embodiments relate to an inexpensive and environmentally friendly bilayer chromium nitride material layer which when located and formed upon or over a metal substrate or an organic polymer substrate which gives substantially the same appearance and performance as a bright electroplated chromium layer, which involves hazardous materials in production.

As well, the embodiments also relate to an inexpensive and environmentally friendly method for forming a bilayer chromium nitride material layer upon or over a metal substrate or an organic polymer substrate which gives substantially the same appearance and performance as a bright electroplated chromium layer, which involves hazardous materials in production.

In an aspect, the embodiments use a bilayer chromium nitride material layer comprising a uniform first chromium nitride material layer and a graded second chromium nitride material layer located and formed over a substrate to provide an article that is formed from the resulting bilayer chromium nitride material layer coated substrate with enhanced reflectivity and inhibited cracking. Within the embodiments, the graded second chromium nitride material layer has an increasing (i.e., generally uniformly increasing) chromium concentration and a decreasing (i.e., generally uniformly decreasing) nitrogen concentration to in a particular embodiment yield a surface of highly reflective chromium and lower portions of variable coefficient of thermal expansion chromium nitride.

As is understood by a person skilled in the art, the embodiments do not require the use of a "basecoat" layer of paint (i.e., such as but not limited to a leveling material layer) under the first chromium nitride material layer, as with other PVD chromium material layer coating methods. In addition, the embodiments also do not require a protective paint "clear-coat" over the chromium nitride material layer, since it has high abrasion and chemical resistance on its own.

A bilayer chromium nitride material layer coating in accordance with the embodiments may be deposited using commercially available vacuum coating systems without requiring any modifications. A bilayer chromium nitride material layer coated article in accordance with the embodiments may be produced at a cost less than an electroplated chromium layer coated article, and uses no environmentally hazardous chemicals or gases.

FIG. 1 shows a schematic cross-sectional diagram of an article including a bilayer chromium nitride material layer located and formed over and upon a substrate in accordance with the embodiments.

As is illustrated within FIG. 1, the article in a first instance comprises a substrate 10. The substrate 10 may in general comprise any of several materials that are used in any of several industrial and consumer applications. In that regard, the substrate 10 may comprise materials selected from the group including but not limited to ceramic materials, metallic materials, organic polymer materials and composites of ceramic materials, metallic materials and organic polymer materials. As well, the substrate 10 may be used in consumer and industrial product applications such as but not limited to reflective product applications and automotive product applications. The substrate 10 may moreover comprise any of several form factors, and although illustrated as a flat substrate within FIG. 1 the substrate 10 need not necessarily be a flat substrate, but the substrate 10 may rather comprise a topographic substrate such as but not limited to a curved surface substrate.

As is also illustrated in FIG. 1, the substrate 10 has located and formed thereupon and thereover a leveling material layer 12 (i.e., a planarizing material layer), which is typically and preferably formed to a thickness from about 1,000 nm to about 25,000 nm. The leveling material layer 12 may comprise a leveling material selected from the group including but not limited to organic polymer leveling materials and inorganic metal oxide leveling materials such as but not limited to sol-gel derived metal oxide leveling materials.

As is also illustrated in FIG. 1, the leveling material layer 12 has located and formed thereupon and thereover a first chromium nitride material layer 14. Within the context of the embodiments the first chromium nitride material layer 14 has a first thickness, a first uniform chromium concentration and a first uniform nitrogen concentration. Within the embodiments, the first thickness is preferably from about 200 to about 1000 nanometers. As well, the first uniform chromium concentration and the first uniform nitrogen concentration are equal in atomic concentration and intended to provide a stoichiometric chromium nitride (i.e., CrN) material layer, although the embodiments are also intended as operative when using non-stoichiometric chromium nitride materials as a starting point.

Finally, FIG. 1 shows a second chromium nitride material layer 16 located and formed upon and over the first chromium nitride material layer 14. Within the embodiments, the second chromium nitride material layer 16 has a second thickness, a second progressively increasing chromium concentration and a second progressively decreasing nitrogen concentration. Within the context of the embodiments, the second thickness is from about 100 to about 150 nm. As well, the second progressively increasing chromium concentration is intended in a particular instance to yield pure chromium for the last 10 nm to 20 nm of the second chromium nitride material layer. In an alternative, the second progressively increasing chromium concentration is intended in another particular instance to yield a chromium rich chromium nitride material at the last portion of the second chromium nitride material layer 16. Such a comparatively chromium rich chromium nitride material may have a chromium:nitrogen atomic ratio from about 1:0.7 to about 1:0.2.

As is described above, a bilayer chromium nitride material layer in accordance with the embodiments (i.e., including the first chromium nitride material layer 14 and the second chromium nitride material layer 16) provides a bilayer chromium nitride material layer coated article with superior reflectivity properties and crack resistance properties.

II. Process Conditions for Forming Bilayer Chromium Nitride Material Layer Coated Article In a first instance, the following listing enumerates manufacturing preferred guidelines for preparing a bilayer chromium nitride material layer coated article in accordance with the embodiments.

A. Apply an organic polymer leveling material layer base coating to fill voids and level a substrate surface, thus creating a smooth substrate surface finish to the substrate desired to be coated when fabricating the article. The organic polymer leveling material layer base coating must be vacuum processing compatible.

B. Prior to bilayer chromium nitride material layer processing achieve a vacuum level that minimizes or eliminates contamination of oxygen, hydrogen and nitrogen gases (i.e., ≤8.0×10e-5 torr).

C. Do not exceed thermal stability limits of either the substrate desired to be coated, or the organic leveling material layer base coating, during processing.

D. Deposit upon the organic leveling material layer base coating a first chromium nitride material layer that offers the durability and abrasion resistance for the product application, and a foundation for a second chromium nitride material layer (i.e. ≥200 nm).

E. Deposit upon the first chromium nitride material layer the second chromium nitride material layer that includes a gradient transition layer ramping, or short steps from a pure chromium nitride material to a pure chromium material (argon is preferred as an inert transition gas, although other inert gases could be used). This second chromium nitride material layer is approximately 100 nm thick with only the last 10 nm to 20 nm deposited as pure chromium.

F. Sputtering parameters for the system configuration used during chromium nitride material layer depositions included (i.e., within the context of a 20% variability):
  1. ~1.0 mtorr nitrogen; and
  2. ~100 watts per square inch power density on sputter cathode (Siena Applied Science 5"×36" planer magnetron), 20 kW, 675V, 30 A (can vary to control thermal load on substrate); where
  3. a deposition rate was controlled by power and time, as well as substrates being rotated in and out of a sputter plasma; and
  4. a gradient layer can either be linear transition from 100% nitrogen to 100% argon or transition with sequential short steps that change nitrogen to argon gas ratio's at 10% increments, since both methods create an alloyed chromium nitride to metallic chromium material layer.

Although included in the embodiment above, the organic leveling material layer base coating may not be required if the surface condition of the substrate is sufficient to yield a desired surface quality of a finished product bilayer chromium nitride material layer coated article. Therefore, the embodiments are not intended as limited to leveling material layer base coated substrate surfaces, and thus the embodiments shall cover the application of the embodied bilayer chromium nitride material layer coating directly upon a substrate. It should also be noted that an organic polymer leveling material layer base coating applied to an organic polymer substrate may actually increase a surface hardness of the organic polymer substrate. The surface hardness of the organic polymer substrate is known to have an effect on the abrasion resistance of the entire substrate-bilayer chromium nitride material layer system. Higher surface hardness translates to improved abrasion resistance in the finished bilayer chromium nitride material layer article. Thus although not required by the embodiments, the inclusion of the organic polymer leveling material layer base coating is frequently desirable.

Further, it is also possible to practice the embodied method when an organic polymer substrate is first planarized with an inorganic leveling material layer, such as but not limited to an $SiO_2$ or related inorganic metal oxide leveling material layer. Thus, a leveling material layer, if present, need not be an organic leveling material layer in composition, but can rather include any type of leveling material composition technology such as but not limited to metallic, glass, crystalline, and others, and shall not be limited to those in any particular embodiment.

It is further known that deposition of chromium in a physical vapor deposition chamber acts as a "getter" for contaminant gasses. Therefore, although achieving an initial vacuum of <8×10e-5 torr is preferred; the embodiments can be carried out at initial pressures substantially higher than this.

In the above embodiments, a goal is to fabricate an article comprising a bright reflective film consistent with look of an electroplated chromium layer. However, if an objective evolves to create a darker layer such as a layer with the look of "plated nickel" or "dark chrome" the color and brightness of a bilayer chromium nitride material layer in accordance with the embodiments may be altered by terminating the gradient within a second chromium nitride material layer at any ratio of nitrogen to argon. This produces a range of color and brightness from the dark chrome (~54% reflective) to full chrome brightness (~76% reflective).

Further, it is contemplated within the embodiments that the bilayer chromium nitride material layer in accordance with the embodiments may be applied to an organic polymer substrate since this particular application may have commercial value. However, the embodiments shall not be limited to organic polymer substrates. Inorganic substrates such as but not limited to glasses, ceramics, crystals and metals are also contemplated as viable substrates within the context of the embodiments.

III. Functional Performance for Bilayer Chromium Nitride Material Layer Coated Articles In order to evaluate viability of the bilayer chromium nitride material layer in accordance with the embodiments, several functional tests were performed upon appropriately prepared samples. Particular test samples, test methods and test results are provided below.

A. Stress Cracking Test

Several polycarbonate test samples were tested to determine resistance to stress induced cracking upon fabrication. To that end, sputtered metallic layers, including bilayer chromium nitride material layers in accordance with the embodiments, were either applied directly upon the polycarbonate substrates or over polycarbonate substrates upon which were first deposited a leveling material layer. Metallic coating layers tested included: (1) a single chromium layer (Cr); (2) a second chromium (Cr) layer over a first chromium nitride (CrN) layer with a discrete interface; and (3) a second layer of graded chromium nitride/chromium (CrN—Cr) over a monolithic chromium nitride (CrN) first layer.

As illustrated in Table I, the only metallic layer coatings which remained crack-free were those consisting of a bilayer graded chromium nitride material layer coating of CrN—Cr over CrN. These bilayer chromium nitride material layer coatings remained crack-free when directly deposited on polycarbonate or on base-paint leveling material layer prepared polycarbonate substrates.

TABLE 1

| Substrate Mat'l | Base Paint | 1st PVD Layer | 2nd PVD Layer | Layer interface | Top Paint | Result |
|---|---|---|---|---|---|---|
| Polycarbonate | Yes | chromium | None | N/A | no | cracking |
| Polycarbonate | Yes | CrN | Chromium | discrete | no | cracking |
| Polycarbonate | Yes | CrN | CrN—Cr | graded | no | no cracking |
| Polycarbonate | No | chromium | None | none | no | cracking |
| Polycarbonate | No | CrN | Chromium | discrete | no | cracking |
| Polycarbonate | No | CrN | CrN—Cr | graded | no | no cracking |

The crack-free samples were subjected to the following functional tests, and all of the crack-free samples remained crack-free throughout the following functional tests.
1. Tests
   a. Adhesion
      Use ASTM D3359
   b. Corrosion
      1. Use ASTM B117
      2. Test time was 50 hours
   c. Thermal Cycle
      Subject the individual samples to 5 cycles of the following:
      1. Ramp to 80+/−2° C. at a transition rate of 1.5+/−0.5°/minute
      2. Soak at 80+/−2° C. for 2 hours 3. Ramp to 23.9+/−2° C. at a transition rate of 1.5+/−0.5°/minute
4. Soak at 23.9+/−2° C. for 1 hour
5. Ramp to −20+/−2° C. at a transition rate of 1.5+/−0.5°/minute
6. Soak at −20+/−2° C. for 2 hours
7. Ramp to 23.9+/−2° C. at a transition rate of 1.5+/−0.5°/minute
8. Soak at 23.9+/−2° C. for 1 hour
2. Performance Requirements
  a. Adhesion
    1. The adhesion loss was evaluated using ASTM D 3359, FIG. 1
    2. Unless otherwise noted the sample was Class 4B or 5B
  b. Corrosion
    1. There was no blistering, delamination or loss of adhesion to the substrate.
    2. ASTM D 3359 FIG. 1 was used for evaluation. The sample was Class 4B or 5B.
  c. Thermal Cycle
    1. There was no blistering, delamination or loss of adhesion to the substrate.
    2. ASTM D 3359 FIG. 1 was used for evaluation. The sample was Class 4B or 5B.

B. Concentrated Acid Vapor Test

Several different metallic-looking bilayer material layer coatings in accordance with the embodiments were applied to 40% glass-filled polyphenylene sulfide plastic substrate. These test samples were tested by suspending them above a beaker filled with a 23% aqueous solution of hydrochloric acid for 24 hours. As illustrated in Table 2, only the samples that included the bilayer chromium nitride material layers survived.

TABLE 2

| Substrate Mat'l | Base Paint | 1st PVD Layer | 2nd PVD Layer | Layer interface | Top Paint | Result |
|---|---|---|---|---|---|---|
| PPS (40% GF) | Yes | stainless steel | None | N/A | yes | coating removed |
| PPS (40% GF) | Yes | chromium | None | N/A | yes | coating removed |
| PPS (40% GF) | Yes | 80/20 nichrome | None | N/A | no | coating removed |
| PPS (40% GF) | Yes | CrN | CrN—Cr (50% Cr) | graded | no | coating intact |
| PPS (40% GF) | Yes | CrN | None | N/A | no | coating intact |
| PPS (40% GF) | Yes | CrN | CrN—Cr (100% Cr) | graded | no | coating intact |

C. CASS Test

A set of test samples similar to the ones used in Table 1 were subjected to a copper chloride acetic acid accelerated salt spray test (CASS Test) according to ASTM B 368-09. As illustrated in Table 3, test results indicate that substrates base-painted prior to bilayer chromium nitride material layer coating performed better within the context of corrosion resistance. This may indicate that base-paint coating a substrate adds additional protection from a salt spray solution attack of a substrate.

TABLE 3

| Substrate Mat'l | Base Paint | 1st PVD Layer | 2nd PVD Layer | Layer interface | Thickness (nm) | CASS Test Results |
|---|---|---|---|---|---|---|
| Polycarbonate | Yes | CrN | CrN—Cr (100% Cr) | graded | 360 | no change |
| Polycarbonate | Yes | CrN | CrN—Cr (100% Cr) | graded | 360 | no change |
| Polycarbonate | Yes | CrN | CrN—Cr (100% Cr) | graded | 490 | no change |
| Polycarbonate | No | CrN | CrN—Cr (100% Cr) | graded | 490 | slight crazing |
| Polycarbonate | Yes | CrN | CrN—Cr (100% Cr) | graded | 360 | no change |
| Polycarbonate | No | CrN | CrN—Cr (100% Cr) | graded | 360 | slight crazing |

All references, including publications, patent applications, and patents cited herein are hereby incorporated by reference in their entireties to the extent allowed, and as if each reference was individually and specifically indicated to be incorporated by reference and was set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein is merely intended to serve as a shorthand method of referring individually to each separate value falling within the range, unless otherwise indicated herein, and each separate value is incorporated into the specification as if it was individually recited herein.

All methods described herein may be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

The invention claimed is:

1. An article comprising:
    a substrate;
    a first chromium nitride material layer located over the substrate and having a first thickness, a first uniform chromium concentration and a first uniform nitrogen concentration; and
    a second chromium nitride material layer beginning with a chromium nitride CrN material having a Cr:N atomic ratio composition of about 1.0:0.7 and located further separated from the substrate and upon the first chromium nitride material layer and having a second thickness, a second progressively graded increasing chromium concentration and a second progressively graded decreasing nitrogen concentration that ends at the exposed surface of the second chromium nitride material layer in at least one of: (1) a pure chromium material; and (2) a comparatively chromium rich chromium nitride material.

2. The article of claim 1 wherein the substrate comprises a material selected from the group consisting of metallic materials, metal oxide materials and organic polymer materials.

3. The article of claim 1 wherein:
    the first thickness is from about 200 to about 1000 nanometers;
    the second thickness is from about 100 to about 150 nanometers;
    the first uniform chromium concentration and the first uniform nitrogen concentration provide an atomic ratio of about 1:1; and
    the second progressively graded increasing chromium concentration and the second progressively graded decreasing nitrogen concentration end in a pure chromium material at the exposed surface of the second chromium nitride material layer.

4. The article of claim 3 wherein the pure chromium material has a thickness from about 10 to about 20 nanometers.

5. The article of claim 1 wherein:
    the first thickness is from about 200 to about 1000 nanometers;
    the second thickness is from about 100 to about 150 nanometers;
    the first uniform chromium concentration and the first uniform nitrogen concentration provide an atomic ratio of about 1:1; and
    the second progressively graded increasing chromium concentration and the second progressively graded decreasing nitrogen concentration end in a comparatively chromium rich chromium nitride material at the exposed surface of the second chromium nitride material layer.

6. The article of claim 5 wherein the comparatively chromium rich chromium nitride material has a chromium: nitrogen atomic ratio from greater than about 1:0.7 to about 1:0.2.

7. The article of claim 1 further comprising a leveling material layer located interposed between the substrate and the first chromium nitride material layer.

8. The article of claim 7 wherein the leveling material layer comprises a material selected from the group consisting of organic polymer materials and inorganic oxide materials.

9. The article of claim 1 wherein the article comprises an automotive component.

10. The article of claim 1 wherein the article comprises a decorative component.

11. An article consisting of:
    a substrate;
    a first chromium nitride material layer located upon the substrate and having a first thickness, a first uniform chromium concentration and a first uniform nitrogen concentration; and
    a second chromium nitride material layer beginning with a chromium nitride CrN material having a Cr:N atomic ratio composition of about 1.0:0.7 and located further separated from the substrate and upon the first chromium nitride material layer and having a second thickness, a second progressively graded increasing chromium concentration and a second progressively graded decreasing nitrogen concentration that ends at the exposed surface of the second chromium nitride material layer in at least one of: (1) a pure chromium material; and (2) a comparatively chromium rich chromium nitride material.

12. An article consisting of:
a substrate;
a leveling material layer located upon the substrate;
a first chromium nitride material layer located upon the leveling material layer and having a first thickness, a first uniform chromium concentration and a first uniform nitrogen concentration; and
a second chromium nitride material layer beginning with a chromium nitride CrN material having a CrN atomic ratio composition of about 1.0:0.7 and located further separated from the substrate and upon the first chromium nitride material layer and having a second thickness, a second progressively graded increasing chromium concentration and a second progressively graded decreasing nitrogen concentration that ends at the exposed surface of the chromium material layer in at least one of: (1) a pure chromium material; and (2) a comparatively chromium rich chromium nitride material.

13. An article comprising:
a substrate;
a first chromium nitride material layer located over the substrate and having a first thickness, a first uniform chromium concentration and a first uniform nitrogen concentration; and
a second chromium nitride material layer having a thickness from about 100 to about 150 nanometers and located further separated from the substrate and upon the first chromium nitride material layer and having a second thickness, a second progressively graded increasing chromium concentration and a second progressively graded decreasing nitrogen concentration that begins with a Cr:N atomic ratio concentration of about 1.0:0.7 and that ends at the exposed surface of the second chromium nitride material layer in at least one of: (1) a pure chromium material; and (2) a comparatively chromium rich chromium nitride material.

14. A method for fabricating an article comprising:
forming over a substrate a first chromium nitride material layer having a first thickness, a first uniform chromium concentration and a first uniform nitrogen concentration; and
forming over the substrate and upon the first chromium nitride material layer a second chromium nitride material layer beginning with a chromium nitride CrN material having a Cr:N atomic ratio composition of about 1.0:0.7 and having a second thickness, a second progressively graded increasing chromium concentration and a second progressively graded decreasing nitrogen concentration that ends at the exposed surface of the second chromium nitride material layer in at least one of: (1) a pure chromium material; and (2) a comparatively chromium rich chromium nitride material.

15. The method of claim 14 wherein:
the first thickness is from about 200 to about 1000 nanometers;
the second thickness is from about 100 to about 150 nanometers;
the first uniform chromium concentration and the first uniform nitrogen concentration provide an atomic ratio of about 1:1; and
the second progressively graded increasing chromium concentration and the second progressively graded decreasing nitrogen concentration end in a pure chromium material at the exposed surface of the second chromium nitride material layer.

16. The method of claim 14 wherein:
the first thickness is from about 200 to about 1000 nanometers;
the second thickness is from about 100 to about 150 nanometers;
the first uniform chromium concentration and the first uniform nitrogen concentration provide an atomic ratio of about 1:1; and
the second progressively graded increasing chromium concentration and the second progressively graded decreasing nitrogen concentration end in a comparatively chromium rich chromium nitride material at the exposed surface of the second chromium nitride material layer.

17. The method of claim 14 wherein the first chromium nitride material layer and the second chromium nitride material layer are formed using a sputtering deposition method.

18. The method of claim 14 wherein the first chromium nitride material layer and the second chromium nitride material layer are formed using a PVD method.

19. The method of claim 14 further comprising forming a leveling material layer interposed between the substrate and the first chromium nitride material layer.

20. The method of claim 19 wherein the forming the leveling material layer comprises forming an organic polymer leveling material layer.

21. The method of claim 19 wherein the forming the leveling material layer comprises forming an inorganic leveling material layer.

* * * * *